(12) United States Patent
Tseng et al.

(10) Patent No.: US 9,378,990 B2
(45) Date of Patent: Jun. 28, 2016

(54) ADJUSTING INTENSITY OF LASER BEAM DURING LASER OPERATION ON A SEMICONDUCTOR DEVICE

(71) Applicant: Taiwan Semiconductor Manufacturing Company Limited, Hsin-Chu (TW)

(72) Inventors: Lee-Te Tseng, Hsinchu (TW);
Chih-Hsien Ou, Taipei (TW);
Kun-Hsiang Lin, Taipei (TW); Yi-Hann Chen, Hsinchu (TW); Ming-Te Chen, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/753,648

(22) Filed: Jun. 29, 2015

(65) Prior Publication Data

US 2015/0303080 A1    Oct. 22, 2015

Related U.S. Application Data

(62) Division of application No. 13/726,271, filed on Dec. 24, 2012, now Pat. No. 9,070,591.

(51) Int. Cl.
*H01L 21/00* (2006.01)
*H01L 21/67* (2006.01)
*H01L 21/66* (2006.01)
*G01J 1/42* (2006.01)
*G01J 5/10* (2006.01)

(52) U.S. Cl.
CPC ......... *H01L 21/67115* (2013.01); *G01J 1/4257* (2013.01); *G01J 5/10* (2013.01); *H01L 21/67242* (2013.01); *H01L 22/12* (2013.01); *H01L 22/26* (2013.01); *H01L 2924/0002* (2013.01)

(58) Field of Classification Search
CPC ................... H01L 21/67115; H01L 21/67242; G01J 1/4257; G01J 5/10
See application file for complete search history.

(56) References Cited

U.S. PATENT DOCUMENTS

| | | | |
|---|---|---|---|
| 5,474,940 A | 12/1995 | Tsukamoto | |
| 5,727,017 A * | 3/1998 | Maurer et al. | 374/9 |
| 6,815,235 B1 | 11/2004 | Markle | |

FOREIGN PATENT DOCUMENTS

KR          2006088276      *    8/2006

* cited by examiner

*Primary Examiner* — Richard Booth
(74) *Attorney, Agent, or Firm* — Cooper Legal Group, LLC

(57) ABSTRACT

Among other things, a system and method for adjusting the intensity of a laser beam applied to a semiconductor device are provided for herein. A sensor is configured to measure the intensity of a laser beam reflected from the semiconductor device. Based upon the reflection intensity, an intensity of the laser beam that is applied to the semiconductor device is adjusted, such as to alter an annealing operation performed on the semiconductor device, for example.

20 Claims, 6 Drawing Sheets

ADJUSTING INTENSITY OF LASER BEAM DURING LASER OPERATION ON A SEMICONDUCTOR DEVICE

RELATED APPLICATION

This application is a divisional of U.S. Non-Provisional patent application Ser. No. 13/726,271, titled "ADJUSTING INTENSITY OF LASER BEAM DURING LASER OPERATION ON A SEMICONDUCTOR DEVICE" and filed on Dec. 24, 2012, which is incorporated herein by reference.

BACKGROUND

As consumers continue to demand thinner, lighter, and smaller electronic devices (e.g., televisions, personal computers, tablets, cellular telephones, etc.), the premium placed on real-estate within such devices has grown. Accordingly, semiconductor manufacturers are pressed to create smaller and faster semiconductor circuits that also consume less power (e.g., to improve energy efficiency and/or reduce battery consumption). Circuitry comprising field-effect transistors (FETs), such as complementary-metal-oxide-semiconductors (CMOSs), has grown in popularity due to this demand for smaller, faster, and/or more energy efficient circuitry.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more systems and techniques for adjusting the intensity of a laser beam applied to a semiconductor device are provided for herein. In some embodiments, the laser beam is applied to the semiconductor device to perform an anneal operation, such as to heat one or more layers of the semiconductor device, for example. Typically, when a laser beam is applied to a semiconductor device, some of the energy is reflected from the semiconductor device and some of the energy is absorbed by the semiconductor device (e.g., causing the semiconductor device to increase in temperature). A degree to which the laser beam is reflected is a function of, among other things, one or more properties of a material to which the laser beam is directed. By way of example, in some embodiments, low emissivity films formed on a semiconductor device reflect less energy than high emissivity films.

In some embodiments, the reflection intensity of the laser beam (e.g., the magnitude at which the laser beam is reflected from the semiconductor) is measured and an intensity at which the laser beam is applied to the semiconductor device is adjusted as a function of the reflection intensity. That is, for example, the reflection intensity of the laser beam is measured while the laser beam is being applied to the semiconductor device. Based upon this measurement changes are made to the intensity at which the laser beam is applied to the semiconductor. In this way, in some embodiments, the intensity of the laser beam applied to the semiconductor device is adjusted to compensate for differences in the material(s) to which laser beam is directed. Further, in some embodiments, the foregoing technique is utilized to control thermal absorption by the semiconductor device (e.g., to control the temperature of the semiconductor device during an anneal operation).

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features is arbitrarily increased and/or reduced for clarity of discussion.

DETAILED DESCRIPTION

Figure 1:
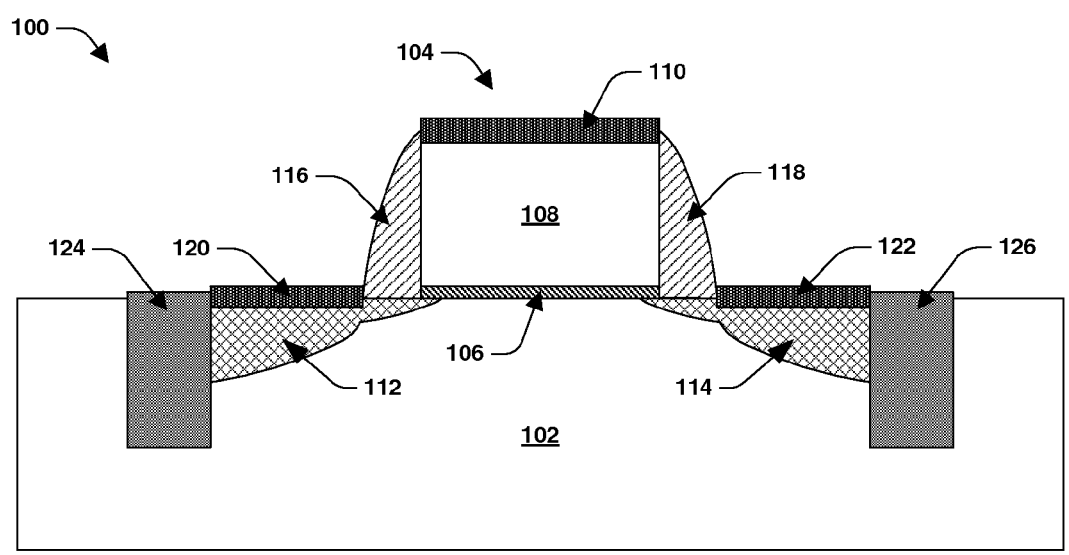
FIG. 1 illustrates a cross-sectional view of an example semiconductor device.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

Semiconductors are formed using a variety of operations. Example operations include, among other things, physical vapor deposition (PVD), chemical vapor deposition (CVD), atomic layer deposition (ALD), plating, epitaxially growing, etc. Another operation frequently utilized is an anneal operation, where the semiconductor device (e.g., or a portion thereof, such as a single layer of the semiconductor device) is heated to change a property or properties of the semiconductor device. In some embodiments, one or more of such processes include the use of a laser configured to apply a laser beam to the semiconductor device. For example, in some embodiments, the anneal operation includes using a laser beam to heat the semiconductor device (e.g., or merely a portion of the semiconductor device).

As provided for herein, one or more systems and techniques for applying a laser beam to a semiconductor device are provided. An intensity at which the laser beam is emitted by a laser is varied based upon a degree to which the laser beam is reflected from the semiconductor device. That is, for example, a reflection intensity of the laser beam is measured, and an applied intensity of the laser beam is adjusted as a function of the reflection intensity. In this way, in some embodiments, a laser is dynamically controlled to adjust the applied intensity of the laser beam as a function of the material to which the laser beam is directed (e.g., where various types, thickness, etc. of materials reflect various percentages of the laser beam or electromagnetic radiation of the laser beam). In other embodiments, the laser is dynamically controlled to adjust the applied intensity of the laser beam as a function of localized variations in the material (e.g., caused by defects during a formation of the semiconductor device or, more particularly, during a formation of a layer to which the laser beam is directed). In this way, in some embodiments, thermal absorption by the semiconductor device is controlled by adjusting the applied intensity of the laser beam (e.g., to reduce piping defects or other defects caused by the semiconductor device heating too rapidly or not heating to a desired temperature), for example.

As used herein, applied intensity is generally intended to refer to a magnitude at which a laser beam is emitted from a laser. That is, for example, applied intensity typically refers to a magnitude of electromagnetic radiation emitted from the laser.

Further, reflection intensity is generally intended to refer to a magnitude at which the laser beam is reflected from the semiconductor device. That is, for example, reflection intensity typically refers to a magnitude of electromagnetic radiation that is reflected from the semiconductor device when a laser is applied thereto.

Referring to FIG. 1, a cross-sectional view of an example semiconductor device 100 at least partially formed by applying a laser beam to the semiconductor device 100 is provided. In the illustrated embodiment, the semiconductor device 100 is a field-effect transistor (FET), although the instant application, including the scope of the claims, is not intended to be limited to a field-effect transistor. For example, in other embodiments, the semiconductor device 100 comprises resistors, capacitors, memory cells, light emitting diodes, etc.

The semiconductor device 100 is formed on a substrate 102 (e.g., a wafer). In some embodiments, the substrate 102 is a silicon substrate. Other example materials for the substrate 102 include, among other things, germanium, diamond, silicon carbide, gallium arsenide, indium arsenide, indium phosphide, etc. In some embodiments, an anneal operation is performed on the substrate 102 to allow dopants, such as boron, phosphorous, or arsenic, for example, to diffuse into the substrate.

The semiconductor device 100 comprises a gate stack 104, a source region 112, and a drain region 114 formed on or within the substrate 102. In the example embodiment, the gate stack 104 comprises a gate dielectric layer 106 and a gate electrode 108. The gate dielectric layer 106 adjoins the substrate 102 and is comprised of a dielectric material, such as metal oxides, metal nitrides, metal silicates, transition metal-oxides, transition metal-nitrides, transition metal-silicates, oxynitrides of metals, metal aluminates, zirconium silicate, zirconium aluminate, for example. The gate electrode 108 comprises one or more layers, which includes interface layers, capping layers, and/or sacrificial layers, for example. By way of example, in some embodiments, the gate electrode 108 comprises a polysilicon layer. In some embodiments, one or more dopant materials, such as p-type dopants or n-type dopants, are added to the one or more layers of the gate electrode 108, such as the polysilicon layer, for example. Example techniques for forming such layers include physical vapor deposition (PVD), chemical vapor deposition (CVD), atomic layer deposition (ALD), and/or plating, for example.

In the illustrated embodiment, the gate stack 104 further comprises a silicide region 110 that is formed above the gate electrode (e.g., on a diametrically opposite side of the gate electrode 108 relative to the gate dielectric layer 106). In some embodiments, the silicide region 110 is configured to reduce contact resistance at the gate stack 104 (e.g., to reduce gate resistance), thereby affecting (e.g., improving) one or more operating characteristics of the semiconductor device 100, for example. Example materials for the silicide region 110 include metal silicides, such as cobalt silicide, titanium silicide, nickel silicide, platinum silicide, tantalum silicide, tungsten silicide, etc., for example. In some embodiments, the silicide region 110 is formed by depositing a layer of metal and performing an anneal operation on the metal to convert the metal into a metal silicide, such as by reacting the metal with polysilicon of the gate electrode 108, for example. In other embodiments, other suitable techniques are utilized to form the silicide region 110.

The source region 112 is typically formed in the substrate 102 on a first side of the gate stack 104 and the drain region 114 is typically formed in the substrate 102 on a diametrically opposite side of the gate stack 104. The source region 112 and the drain region 114 respectively comprise a semiconductor material, such as a monocrystalline semiconductor material. In some embodiments, the source region 112 and the drain region 114 comprise a substantially same semiconductor material. In other embodiments, the source region 112 comprises a different semiconductor material or a different concentration of the semiconductor material relative to the drain region 114. In some embodiments, the source region 112 and the drain region 114 are formed by an implantation process to form/define the source 112 and the drain 114 (e.g., wherein the implantation process introduces dopants, such as arsenic, phosphorous, boron, etc. into the substrate 102), for example. In other embodiments, other suitable techniques are utilized to form the source region 112 or the drain region 114.

The example semiconductor device 100 further comprises sidewall spacers 116, 118, which are formed on opposite sidewalls of the gate stack 104. In some embodiments, a first sidewall spacer 116 is comprised of one or more layers of dielectric material and a second sidewall spacer 118 is comprised of one or more layers of dielectric material. As an example, in some embodiments, the first sidewall spacer 116 and the second sidewall spacer 118 respectively comprise two layers. A first layer of the two layers includes a nitride composition, such as silicon nitride, and the second layer of the two layers includes an oxide composition, such as silicon oxide, for example. Other example materials for one or more layers of the first sidewall spacer 116 or the second sidewall spacer 118 include silicon carbide and silicon oxynitride, for example. In some embodiments, such sidewall spacers 116, 118 facilitate lateral electric distance control, for example. In other embodiment, the sidewall spacers 116,118 facilitate defining the source region 112 and the drain region 114, such as by directing implanted dopants into particular regions of the substrate 102, for example.

In the illustrated embodiment, the semiconductor device 100 further comprises a second silicide region 120 formed spatially proximate the source region 112 and a third silicide region 122 formed spatially proximate the drain region 114. More particularly, the second silicide region 120 is positioned on top of the source region 112 (e.g., to cap the source region 112) and the third silicide region 122 is positioned on top of the drain region 114 (e.g., to cap the drain region 114). In some embodiments, the second silicide region 120 is configured to reduce contact resistance at the source region 112 (e.g., to reduce source resistance) and the third silicide region 122 is configured to reduce contact resistance at the drain region 114 (e.g., to reduce drain resistance), thereby affecting (e.g., improving) one or more operating characteristics of the semiconductor device 100, for example. Example materials for the silicide regions 120, 122 include metal silicides, such as cobalt silicide, titanium silicide, nickel silicide, platinum silicide, tantalum silicide, tungsten silicide, etc. In some embodiments, the second silicide region 120 and the third silicide region 122 are formed by depositing a layer of metal and performing an anneal operation on the metal to convert the metal into a metal silicide. In other embodiments, other suitable techniques are utilized to form the second silicide region 120 and the third silicide region 122.

In some embodiments, the semiconductor device 100 is electrically isolated from one or more neighboring semiconductor devices (not shown) (e.g., such as other FETs) via an isolation layer. By way of example, in the illustrated embodiment, the semiconductor device 100 is electrically isolated from neighboring semiconductor devices via a first isolation layer 124 located spatially proximate the source region 112 and a second isolation layer 126 located spatially proximate the drain region 114. In other embodiments, the semiconductor device 100 is electrically isolated from neighboring semiconductor devices at merely the source region or merely the drain region. As an example, in some embodiments, an isolation layer is formed proximate the source region 112 but not the drain region 114. In at least some of these embodiments, the drain region 114 of the semiconductor device 100 functions as a source or a drain for a second semiconductor device, for example. In still other embodiments, no isolation layers are present between the semiconductor device and other neighboring semiconductor devices. In some embodiments, such isolation layers 124, 126 are formed by respectively etching recesses in the substrate 102 and at least partially filling the recesses with a dielectric material or substantially non-conductive material.

Figure 2:
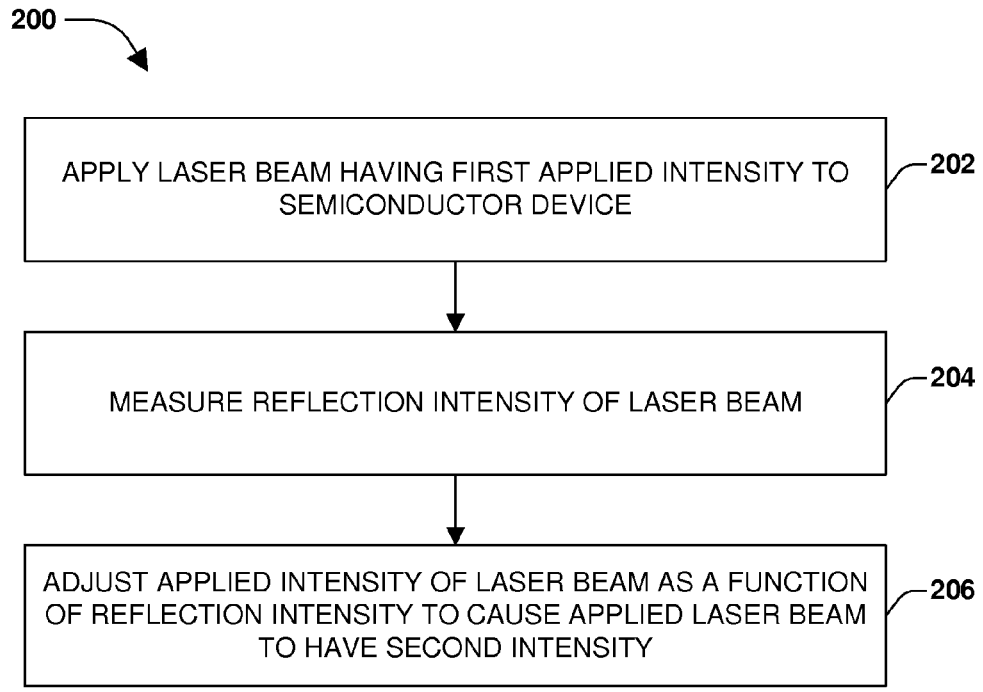
FIG. 2 illustrates a flow diagram of an example method for adjusting an applied intensity of a laser beam as a function of a reflection intensity.

FIG. 2 illustrates an example method 200 for adjusting the intensity of a laser beam applied to a semiconductor device, such as the semiconductor device 100 illustrated in FIG. 1, as a function of an intensity at which the laser beam is reflected from the semiconductor device. In some embodiments, the example method 200 finds applicability to an anneal operation configured to apply a laser beam to the semiconductor device to alter one or more properties of the semiconductor device. As an example, in some embodiments, a laser is utilized as a heating element and is configured to emit a laser beam that thermally alters the semiconductor device to form at least one of the substrate 102, a first silicide region 110, a second silicide region 120, and a third silicide region 122 of the semiconductor device 100. It is to be appreciated that while the specific reference is made herein to utilizing the laser or laser beam as part of an anneal operation, the instant application, including the scope of the claims, is not intended to be limited to use with an anneal operation.

At 202 in the example method 200 a laser beam is applied to the semiconductor device. The laser beam is applied at a first applied intensity and typically has a first wavelength. The magnitude of the wavelength is typically a function of the laser being utilized to perform the operation. For example, a ruby laser typically has a wavelength of about 694 nm, a XeF laser typically has a wavelength of about 308 nm, a KrF laser typically has a wavelength of about 249 nm, and an ArF laser typically has a wavelength of about 193 nm. It is to be appreciated that the foregoing list of lasers are merely provided as example types of lasers and that other lasers suitable for the process being performed on the semiconductor device are also contemplated.

Generally, the intensity of the laser beam that is applied to the semiconductor device is in the range of between about 650 mJ/cm$^2$ to about 1100 mJ/cm$^2$. However, in other embodiments, the intensity of the laser beam that is applied to the semiconductor device is below about 650 mJ/cm$^2$ or exceeds about 1100 mJ/cm$^2$. In some embodiments, the first applied intensity, or an intensity at which the laser beam is initially applied to the semiconductor device is a function of the type of material to which the laser beam is directed (e.g., such as the type of metal). In some other embodiments, the first applied intensity, or an intensity at which the laser beam is initially applied to the semiconductor device is a function of a thickness of the material to which the laser beam is directed. In still other embodiments, that first applied intensity is selected at random or selected to be a (e.g., low) value to reduce a probability of undesirably heating the semiconductor device.

It is to be appreciated that while reference is made herein to applying the laser beam to the semiconductor device, such terminology is intended to include the possibility of the laser beam being applied to a mere portion of the semiconductor device or to multiple semiconductor devices. For example, with respect to an annealing operation, in some embodiments the laser beam is directed to merely a portion of semiconductor device to be annealed. Accordingly, applying the laser beam to the semiconductor device is intended to encompass applying the laser beam to less than all of the semiconductor device (e.g., such as a mere portion of layer of the semiconductor device).

At 204 in the example method 200, a reflection intensity of the laser beam is measured. The reflection intensity is indicative of a magnitude at which the laser beam is reflected from the semiconductor device. That is, for example, the reflection intensity is indicative of the electromagnetic radiation generated by the laser that was reflected by the semiconductor device and thus not absorbed by the semiconductor device. By way of example, in some embodiments, one or more sensors, such as a pyrometer, for example, are positioned spatially proximate the laser to measure an amount of electromagnetic radiation reflected by the semiconductor device and associated with the laser beam.

In some embodiments, measuring the reflection intensity of the laser beam at 204 comprises filtering one or more wavelengths associated with the laser beam from one or more wavelengths not associated with the laser beam (e.g., so that the electromagnetic radiation that is measured is associated with the laser and not associated with other light sources). In this way, information from a portion of the light spectrum that is not associated with the laser beam is discarded or otherwise not factored into the measurement, for example (e.g., shielding light noise or electromagnetic radiation from the measurement).

It is to be appreciated that the difference between the reflection intensity and the applied intensity is approximately equal to an amount of energy absorbed by the semiconductor device. In some embodiments, the electromagnetic radiation from the laser beam is converted to thermal energy upon absorption, and thus the thermal absorption of the semiconductor device can be approximated based upon the measured reflection intensity, for example. By way of example, high emissivity films of a semiconductor device, such as high emissivity metals, typically reflect a greater percentage of the laser beam's energy relative to low emissivity films, such as low emissivity metals. Accordingly, low emissivity films typically thermally absorb a larger percentage of the laser beam's energy than higher emissivity films. As such, low emissivity films tend to increase in temperature more rapidly than higher emissivity films when an identical laser beam is applied thereto. Thus, by measuring the reflection intensity, an estimate of the thermal absorption can be derived and changes in the intensity can be made to achieve a desired thermal absorption (e.g., or heating rate).

At 206 in the example method 200, an applied intensity of the laser beam is adjusted as a function of the reflection intensity. In this way, the applied intensity is altered from a first applied intensity to a second applied intensity, that is different in magnitude than the first applied intensity, based upon how much of the laser beam is being reflected from the semiconductor device. In some embodiments, the second applied intensity is greater than the first applied intensity. In other embodiments, the second applied intensity is less than the first applied intensity. Typically, the wavelength of the laser beam remains substantially constant while adjusting the applied intensity, although in some embodiments the wavelength of the laser beams is also varied from time-to-time.

A degree to which the applied intensity is adjusted is a function of the reflection intensity of the laser beam. By way of example, in some embodiments, a desired reflection intensity is set (e.g., to achieve a desired thermal absorption). When the measured reflection intensity is greater than the desired reflection intensity (e.g., indicating that less of the laser beam's energy is being absorbed by the semiconductor device than desired), the applied intensity is increased to increase the amount of energy that is absorbed by the semiconductor device, for example. When the measured reflection intensity is less than the desired reflection intensity (e.g., indicating that more of the laser beam's energy is being absorbed by the semiconductor device than desired, thus potentially resulting in the semiconductor device heating too quickly), the applied intensity is decreased to decrease the amount of energy that is absorbed by the semiconductor device, for example.

In some embodiments, adjusting the applied intensity of the laser beam comprises adjusting an amount of power supplied to a laser emitting the laser beam. In other embodiments, an amount of power supplied to the laser emitting the laser beam is held constant while the applied intensity of the laser beam is adjusted. For example, in some embodiments, the current supplied to the laser and the voltage applied to the laser are inversely changed to alter the applied intensity while maintaining a substantially constant power supply.

In some embodiments, one or more safeguards are provided to mitigate substantial changes in the applied intensity, such as due to abnormalities in the measured reflection intensity, for example. In some embodiments, for example, a first measurement of the reflection intensity (e.g., a present measurement of the reflection intensity) is compared to an average measurement of the reflection intensity to determine a degree of deviation between the first measurement and the average measurement. When the degree of deviation falls within a specified threshold, the applied intensity is adjusted. When the degree of deviation does not fall within the specified threshold (e.g., thus potentially indicating an abnormality in the measurement or the semiconductor device) the applied intensity is not adjusted.

Moreover, in some embodiments, one or more safeguards are provided to mitigate substantial changes in the power supplied to the laser (e.g., which result in performance degradation by the laser or a power supply configured to supply power to the laser). That is, for example, in some embodiments, a range over which power supplied to the laser can be adjusted is limited. For example, in some embodiment, an adjustment to the amount of power supplied to the laser is permitted if the level of the adjustment is within a permissible threshold and is not permitted if the level of the adjustment is not within the permissible threshold. By way of example, in some embodiments, a threshold is set at ±10%. Thus, in such embodiments, a request to alter the power level by more than 10% is denied (e.g., or the power level is increased by no more than 10%) while a request to alter the power level by less than 10% is granted. In other embodiments, other thresholds are set to limit power output compensation, for example.

In some embodiments, one or more acts of the example method 200 are repeated a plurality of times during the operation of the laser. For example, in some embodiments, the reflection intensity is measured tens of thousands of times during the operation and adjustments to the applied intensity are made accordingly as a function of the measured reflection intensity. In some embodiments, the reflection intensity is measured in real-time (e.g., while the laser is emitting the laser beam) at least 21,000 times, for example, to facilitate making minute adjustments to the applied intensity.

Figure 3:
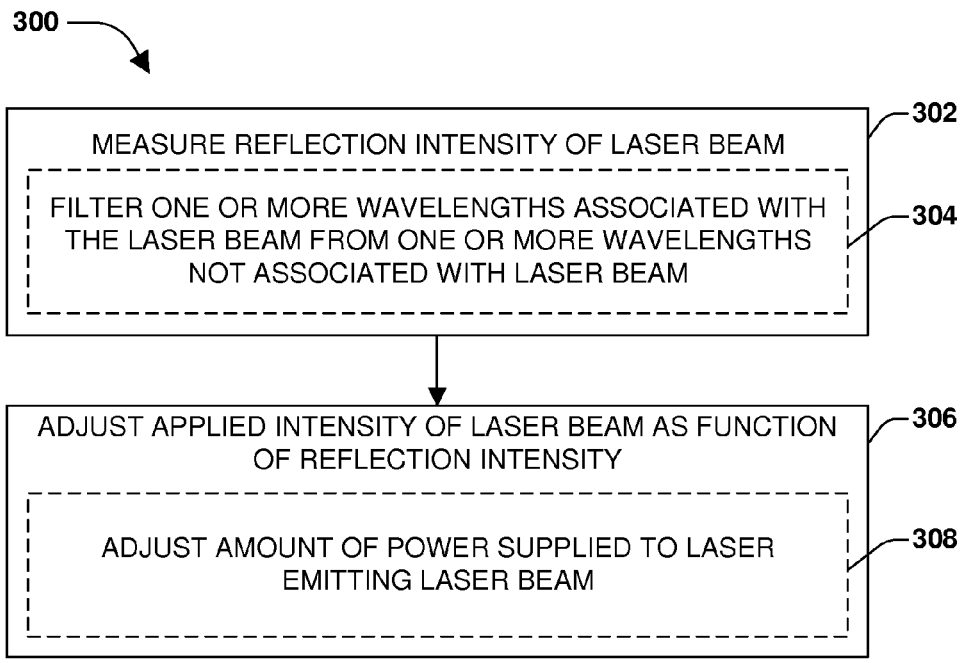
FIG. 3 illustrates a flow diagram of an example method for adjusting an applied intensity of a laser beam as a function of a reflection intensity.

FIG. 3 illustrates another example method 300 for adjusting an intensity of a laser beam applied to a semiconductor device to perform an operation, such as an anneal operation, inspection operation, etc.

At 302 in the example method 300, a reflection intensity of the laser beam applied to the semiconductor device is measured. The reflection intensity is indicative of a magnitude at which the laser beam is reflected from the semiconductor device. That is, for example, a laser beam is applied to the semiconductor device and an amount of energy associated with the laser beam that is reflected from the semiconductor device is measured.

In some embodiments, the measured reflection intensity is merely indicative of a reflection of the laser beam and is not indicative of the intensity of other electromagnetic radiation generated by one or more other lights sources. By way of example, in the method 300, measuring the reflection intensity of the laser beam comprises filtering one or more wavelengths associated with the laser beam from one or more wavelengths not associated with the laser beam at 304. In this way, a portion of a spectrum electromagnetic radiation not associated with the laser beam is excluded from the measurement of the reflection intensity, for example.

At 306 in the example method 300, the applied intensity of the laser beam is adjusted as a function of the reflection intensity. That is, for example, an amount of energy applied to the semiconductor device via the laser beam is adjusted as a function of the reflection intensity. The applied intensity is adjusted upward or downward as a function of the reflection intensity. By way of example, in some embodiments, a desired reflection intensity is specified. When the measured reflection intensity is higher than the desired reflection intensity (e.g., indicating that more energy is reflected from the semiconductor device than desired), the applied intensity is increased to increase the amount of energy that is absorbed by the semiconductor device. In this way, where the energy absorbed by the semiconductor device is converted to heat energy, increasing the applied intensity causes the rate at which a semiconductor device increases in temperature to increase, for example. When the measured reflection intensity is less than the desired reflection intensity (e.g., indicating that less energy is reflected from the semiconductor device than desired), the applied intensity is decreased to decrease the amount of energy that is absorbed by the semiconductor device. In this way, where the energy absorbed by the semiconductor device is converted to heat energy, decreasing the applied intensity causes the rate at which a semiconductor device increases in temperature to decrease, for example.

In the example method 300, adjusting the applied intensity of the laser beam comprises adjusting an amount of power supplied to a laser emitting the laser beam at 308. That is, the intensity at which the laser emits the laser beam is a function of the power supplied to the laser. In other embodiments, an amount of power supplied to the laser emitting the laser beam is held constant while the applied intensity of the laser beam is adjusted. For example, in some embodiments, the current supplied to the laser and the voltage applied to the laser are inversely changed to adjust the applied intensity while maintaining a substantially constant power supply.

It is to be appreciated that, in some embodiments, the safeguards described with respect to example method 200 of FIG. 2 and/or other features described with respect to the example method 200 that do not contradict with features of the example method 300 also find applicability to the example method 300 but are not further described with respect to the example method 300 for purposes of brevity. Moreover, in some embodiments, features described with respect to the example method 300 that do not contradict with features of the example method 200 also find applicability to the example method 200.

Figure 4:
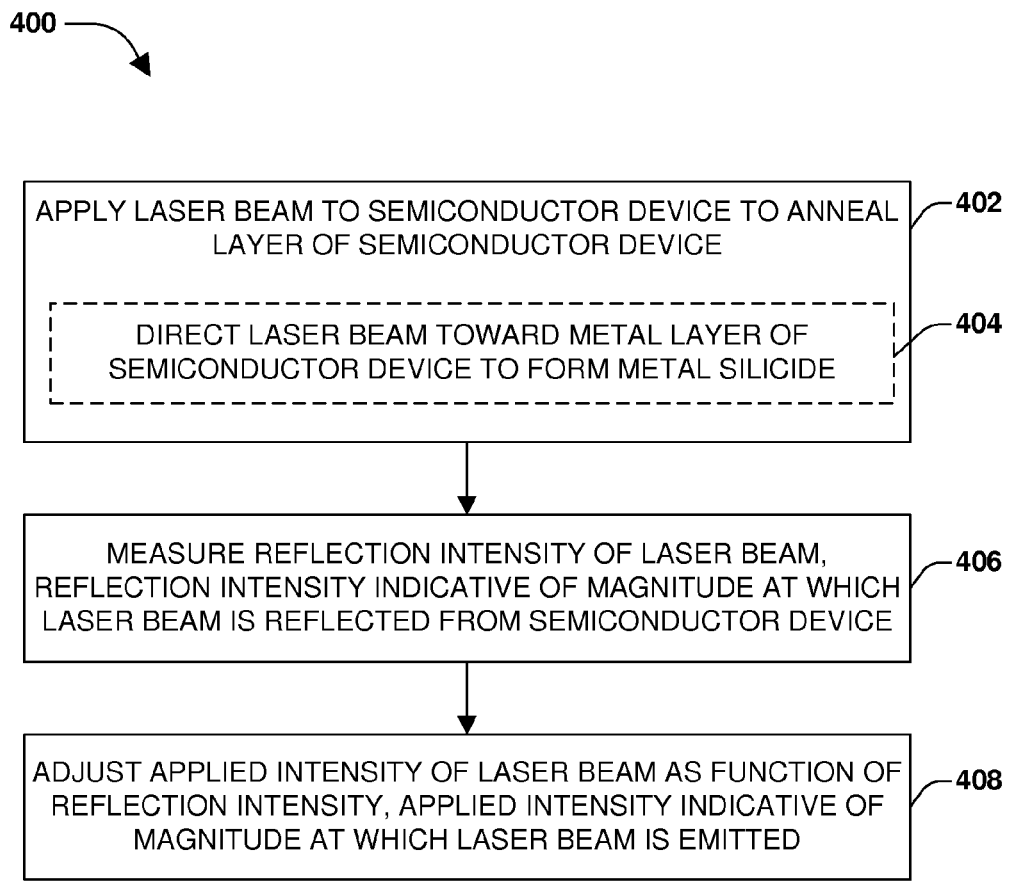
FIG. 4 illustrates a flow diagram of an example method for adjusting an applied intensity of a laser beam as a function of a reflection intensity.

FIG. 4 illustrates an example method 400 for an anneal operation, whereby a temperature of the semiconductor device is altered (e.g., increased) by a heating element, such as a laser. In some embodiments, such an anneal operation is performed to form one or more metal silicides, such as the metal silicide 110 of the gate stack, the metal silicide 120 spatially proximate the source region 112, or the metal silicide 122 spatially proximate the drain region 114, for example. In other embodiments, an anneal operation is performed to introduce or activate dopant in a substrate upon which the semiconductor is formed, such as the substrate 102, for example.

In some embodiments, prior to the anneal operation beginning, a layer of metal is formed on a structure comprising silicon, such as the substrate, gate electrode 108, source region 112, or drain region 114, for example. In some embodiments, the layer of metal is formed using a physical vapor deposition (PVD) process. In other embodiments, the layer of metal is formed using a chemical vapor deposition (CVD) process. Example materials for the metal include cobalt, nickel, titanium, tantalum, platinum, tungsten, etc. Example materials for dopants that may be implanted and annealed or activated include boron, phosphorous, arsenic, etc. In some embodiments, the thickness of the layer of metal is a function of the application for the semiconductor device 100. In other embodiments, the thickness of the layer of metal is a function of where the layer of metal is formed in relation to other features of the semiconductor device, such as gate, source, and drain, for example.

In some embodiments, the anneal operation described in the example method 400 is performed in a single action. In other embodiments, the anneal operation is performed in a multi-act process, whereby respective portions of the layer of metal or dopants are heated multiple times. During at least a portion of the anneal operation, a laser is utilized to apply a laser beam to the semiconductor device to form a metal silicide from the layer of metal or to form a doped layer or region, for example. In some embodiments, other heat sources, in addition to the laser, are also utilized during at least some of the anneal operation to further alter a temperature of the semiconductor device (e.g., or region of the semiconductor device in which the metal silicide or dopant region or layer is formed), for example.

At 402 in the example method 400, a laser beam is applied to the semiconductor device to anneal a layer of the semiconductor device. That is, for example, a laser beam is applied to the semiconductor device to heat or otherwise alter a property (ies) of the layer(s) of the semiconductor device to which the laser beam is applied. For example, in the method 400, applying the laser beam to the semiconductor device to anneal a layer of the semiconductor device comprises directing the laser beam toward a metal layer of the semiconductor device to form a metal silicide at 404. In other embodiments, applying the laser beam to the semiconductor device to anneal a layer of the semiconductor device comprises directing the laser beam toward a portion of the semiconductor device where a change in temperature is desired. In still other embodiments, applying the laser beam to the semiconductor device to anneal a layer of the semiconductor device comprises directing the laser beam to a substrate upon which the semiconductor device is formed.

In some embodiments, the wavelength of the laser beam is a function of the laser, although some lasers are configured to emit laser beams at multiple different wavelengths. In some embodiments, the particular wavelength that is selected or particular laser that is selected is a function of the type or thickness of a material to be annealed, for example.

In some embodiments, an initial intensity of the laser beam that is applied to the semiconductor device is a function of the type or thickness of the material to be annealed. In other embodiments, an initial intensity of the laser beam is selected at random or selected to be a low energy value (e.g., to mitigate the possibility of exposing the semiconductor device to an energy level sufficient to cause piping defects or other defects, for example).

At 406 in the example method 400, a reflection intensity of the laser beam is measured. The reflection intensity is indicative of a magnitude at which the laser beam is reflected from the semiconductor device. That is, for example, the reflection intensity is indicative of the energy of the laser beam that has been reflected from the semiconductor device (e.g., and thus not absorbed by the semiconductor device or converted to thermal energy in the semiconductor device).

At 408 in the example method 400, the applied intensity of the laser beam is adjusted as a function of the reflection intensity. That is, for example, the magnitude at which the laser beam is emitted (e.g., and applied to the semiconductor) is adjusted based upon the reflection intensity.

By way of example, during an anneal operation, at least some of the energy of the laser beam is intended to be absorbed by the semiconductor device and converted to thermal energy. Accordingly, the laser beam is utilized to alter (e.g., increase) a temperature of the semiconductor device (e.g., or a layer of the semiconductor device to which the anneal operation is directed). At 408 in the example method, a rate at which the semiconductor device changes temperature is altered by changing the applied intensity. For example, when the measured reflection intensity exceeds a desired reflection intensity, the applied intensity is increased to increase the amount of energy absorbed per unit time and increase the rate at which the temperature of the semiconductor device changes. When the measured reflection intensity is below a desired reflection intensity, the applied intensity is decreased to decrease the amount of energy absorbed per unit time and decrease the rate at which the temperature of the semiconductor device changes. Accordingly, in some embodiments, the amount of energy absorbed per unit time is dynamically adjusted based upon measurements of the reflection intensity. Moreover, in some embodiments, the rate at which the temperature of the semiconductor device changes is dynamically adjusted based upon measurements of the reflection intensity.

It is to be appreciated that, in some embodiments, the safeguards described with respect to example method 200 of FIG. 2 and other features described with respect to the example method 200 and the example method 300 that do not contradict with features of the example method 400 also find applicability to the example method 400 but are not further described with respect to the example method 400 for purposes of brevity. Moreover, in some embodiments, features described with respect to the example method 400 that do not contradict with features of the example method 200 also find applicability to the example method 200 and features described with respect to the example method 400 that do not contradict with features of the example method 300 also find applicability to the example method 300.

Further, in some embodiments, one or more processes are performed after the anneal operation to further form the semiconductor device. For example, in some embodiments, a chemical wash is performed on the semiconductor device to remove excess metal or dopants during or after the anneal operation.

Figure 5:
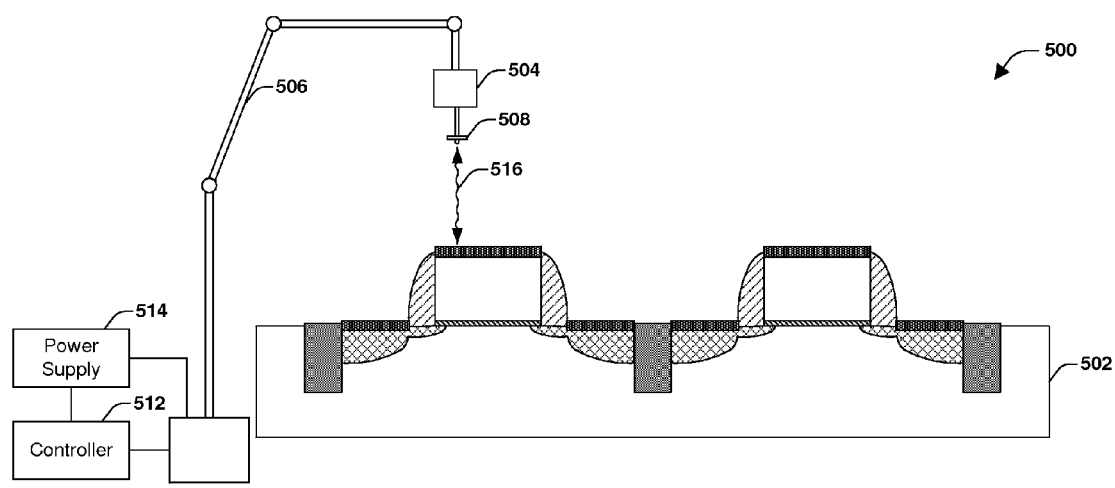
FIG. 5 illustrates an example system for treating a semiconductor device.

FIG. 5 illustrates an example system 500 for treating a semiconductor device 502 via a laser 504. In the illustrated embodiment, the semiconductor device 502 comprises two FETs. However, in other embodiments, a system comprising the features described herein is utilized to treat other semiconductor devices. In some embodiments, the example system 500 is utilized for performing an anneal operation. By way of example, in some embodiments, the laser 504 is configured to alter or change a temperature of at least a portion of the semiconductor device 502. It is to be appreciated that the example system 500 is not intended to be drawn to scale.

The example system 500 comprises a laser 504 configured to apply a laser beam 516 to the semiconductor device 502. In some embodiments, the laser beam 516 emitted by the laser 504 performs an anneal operation on the semiconductor device 502, or a portion thereof. For example, as previously described, in some embodiments, the laser 504 is configured to direct the laser beam 516 toward a specified layer or layers of the semiconductor device 502 to change or increase a temperature of the specified layer or layers. Accordingly, in such embodiments, the laser 504 is configured to emit a laser beam 516 having a wavelength that heats the semiconductor device 502, or a portion thereof, such as a metal layer, for example.

In some embodiments, the laser 504 is a pulse laser configured to intermittently emit a laser beam 516 (e.g., where respective emissions are followed by a resting period during which little to no electromagnetic radiation is emitted). In other embodiments, the laser 504 is a continuously emitting laser 504 configured to continuously emit a laser beam 516 until a stopping criteria is met.

In the illustrated embodiment, the laser 504 is mounted to an articulating arm 506 configured to maneuver the laser 504 relative to the semiconductor device 502 (e.g., which in some embodiments is stationary). In other embodiments, the laser 504 is substantially stationary while the semiconductor device 502 is moved on a conveyor belt or other movable platform. In still other embodiments, both the laser 504 and the semiconductor device 502 are moved during the operation.

It is to be appreciated that by moving the laser 504 relative to the semiconductor device 502, a surface or portion of the semiconductor device 502 is effectively painted with the laser beam 516. For example, in some embodiments, the laser beam 516 emitted by the laser 504 is about 11 mm in diameter. Accordingly, to treat (e.g., perform an anneal operation on) a portion of the semiconductor device 502 having a surface area greater than the diameter of the laser beam 516, such as a surface area of 40 mm$^2$, the laser 504 is moved relative to the semiconductor device 502 to provide for applying the laser beam 516 to the 40 mm$^2$ portion of the semiconductor device 502.

In some embodiments, such as where the laser 504 is a pulse laser, the operation is performed in a step-and-shoot manner. Accordingly, a first pulse of electromagnetic radiation is emitted from the laser 504 while the semiconductor device 502 maintains a first orientation relative to the laser 504, the laser 504 ceases emitting the laser beam 516 and the orientation of the semiconductor device 502 is moved relative to the laser 504, and a second pulse of electromagnetic radiation is emitted from the laser 504 while the semiconductor device 502 maintains the second orientation relative to the laser 504. In other embodiments, such as where the laser 504 is a continuous emitting laser, the laser 504 continues to emit electromagnetic radiation while the orientation of the semiconductor device 502 is changed relative to the laser 504.

The example system 500 further comprises a sensor 508 configured to measure a reflection intensity of the laser beam 516. That is, the sensor 508 is configured to measure a magnitude (of energy) at which the laser beam 516 is reflected from the semiconductor device 502. In some embodiments, the sensor 508 is a pyrometer or other suitable electromagnetic radiation measuring device.

Figure 6:
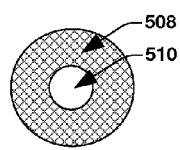
FIG. 6 illustrates a cross-sectional view of an example laser and sensor for measuring reflection intensity.

In some embodiments, the sensor 508 is mounted spatially proximate the laser 504. For example, in some embodiments, the sensor 508 wraps around an outer perimeter of a nozzle of the laser 504 to detect the reflected portion of the laser beam 516. FIG. 6 illustrates an example configuration for the sensor 508 relative to the laser 504. More particularly, FIG. 6 illustrates a cross-sectional view of the example configuration looking into a nozzle 510 of the laser 504 (e.g., such that a laser beam 516 would shoot out of the page). In the illustrated embodiment, the sensor 508 wraps around a circumference or outer perimeter of the nozzle 510 and is comprised of a plurality of sensor elements (e.g., represented by the cross-hatched pattern) respectively configured to measure the reflection intensity of a portion of the laser beam 516 that impinges thereon. By combining the reflection intensity measured by respective sensor elements, a total reflection intensity is measured, for example.

It is to be appreciated that FIG. 6 illustrates merely one example configuration for positioning the sensor 508 relative to the laser 504 or laser nozzle 510. For example, in other embodiments the sensor 504 is positioned on merely one side of the laser nozzle 510. In still other embodiments, the sensor 508 surrounds less than the total perimeter of the nozzle 510. Typically, the sensor 508 is placed spatially proximate the laser 504 to promote detection of the reflected laser beam 516. However, in some embodiments, the sensor 508 is located away from the laser 504. By way of example, in some embodiments, the sensor 508 is located away from the laser 504 and one or more mirrors or other reflective surfaces are configured to direct the reflected laser beam 516 toward the sensor 508.

Returning to FIG. 5, in some embodiments, the sensor 508 is configured to filter one or more wavelengths associated with the laser beam 516 from one or more wavelengths not associated with the laser beam 516. By way of example, in some embodiments, the sensor 508 comprises a physical filter that is placed between the semiconductor device 502 and one or more sensor elements of the sensor 508. Such a physical filter is configured to attenuate electromagnetic radiation that is not associated with the laser beam 516 (e.g., to filter out electromagnetic radiation yielded from other light sources) and to allow electromagnetic radiation associated with the laser beam 516 to pass through the filter and be detected by the sensor element(s). In other embodiments, the sensor 508 comprises an electronic filter configured to separate data or signals generated by the sensor element(s) and indicative of electromagnetic radiation that is associated with the laser beam 516 from data or signals generated by the sensor element(s) and indicative of electromagnetic radiation that is not associated with the laser beam 516, for example.

The example system 500 further comprises a controller 512 that is in operable communication with the sensor 508. The controller 512 is configured to adjust an applied intensity of the laser beam 516 as a function of the reflection intensity. That is, based upon an amount of energy that is reflected from the semiconductor device 502 and detected by the sensor 508, the controller 512 is configured to adjust the intensity of the laser beam 516 that is applied to the semiconductor device 502 (e.g., to achieve a desired energy absorption by the semiconductor device 502). It is to be appreciated that details regarding such an adjustment are further described with respect to the example methods 200, 300, and 400 and are therefore not described with respect to the controller 512 for purposes of brevity. Accordingly, in some embodiments, the controller 512 is configured to perform at least some of the acts of example method 200, at least some of the acts of example method 300, or at least some of the acts of example method 400.

Moreover, in some embodiments, the controller 512 is configured to implement at least some of the safeguards described with respect to the example method 200 of FIG. 2. For example, in some embodiments, the controller 512 is configured to not adjust the applied intensity at a given point in time when a degree of deviation between the reflection intensity, as recently measured, and an average reflection intensity does not fall within a specified threshold. Accordingly, the controller 512 is configured to mitigate adjustments made when the data or signal is indicative of an abnormal measurement or an abnormality in the semiconductor device 502 (e.g., which is reflected in a larger than average change in the reflection intensity), for example.

The example system 500 further comprises a power supply 514 configured to supply power to the laser 504. In some embodiments, the controller 512 is in operable communication with the power supply 514 and is configured to adjust the applied intensity by requesting a change in an amount of power supplied to the laser 504 via the power supply 514. In other embodiments, the controller 512 is configured to request that the power supply 514 alter the current supplied to the laser 504 and alter the voltage 514 applied to the laser 504 inversely to alter the applied intensity while maintaining a substantially constant power output, for example. In still other embodiments, the controller 512 is configured to adjust the intensity of the laser beam 516 without the aid of the power supply 514. For example, in some embodiments, the controller 512 is configured to utilize a filter to alter the intensity of the laser beam 516 emitted by the laser 504 prior to being applied to the semiconductor device 502.

Figure 7:
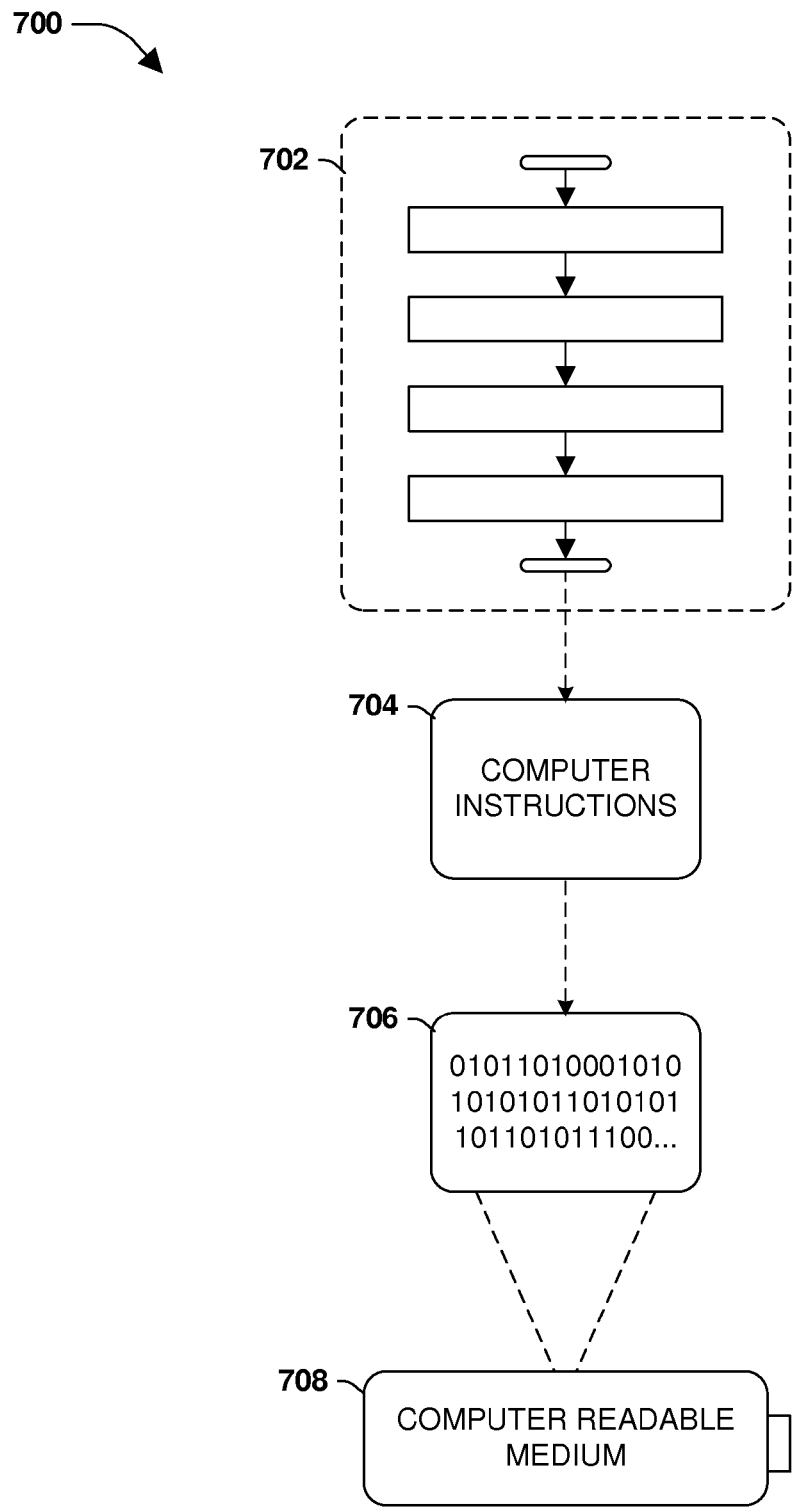
FIG. 7 is an illustration of an example computer-readable medium wherein processor-executable instructions configured to embody one or more of the provisions set forth herein are comprised.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 7, wherein the implementation 700 comprises a computer-readable medium 708, such as a CD-R, DVD-R, flash drive, a platter of a hard disk drive, etc., on which is encoded computer-readable data 706. This computer-readable data 706, such as binary data comprising at least one of a zero or a one, in turn comprises a set of computer instructions 704 configured to operate according to one or more of the principles set forth herein. In some embodiments, the processor-executable computer instructions 704 are configured to perform a method 702, such as at least some of the exemplary method 200 of FIG. 2, at least some of the exemplary method 300 of FIG. 3, or at least some of the exemplary method 400 of FIG. 4, for example. In some embodiments, the processor-executable instructions 704 are configured to implement a system, such as at least some of the exemplary system 500 of FIG. 5, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component includes a process running on a processor, a processor, an object, an executable, a thread of execution, a program, or a computer. By way of illustration, both an application running on a controller and the controller can be a component. One or more components residing within a process or thread of execution and a component is localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 8:
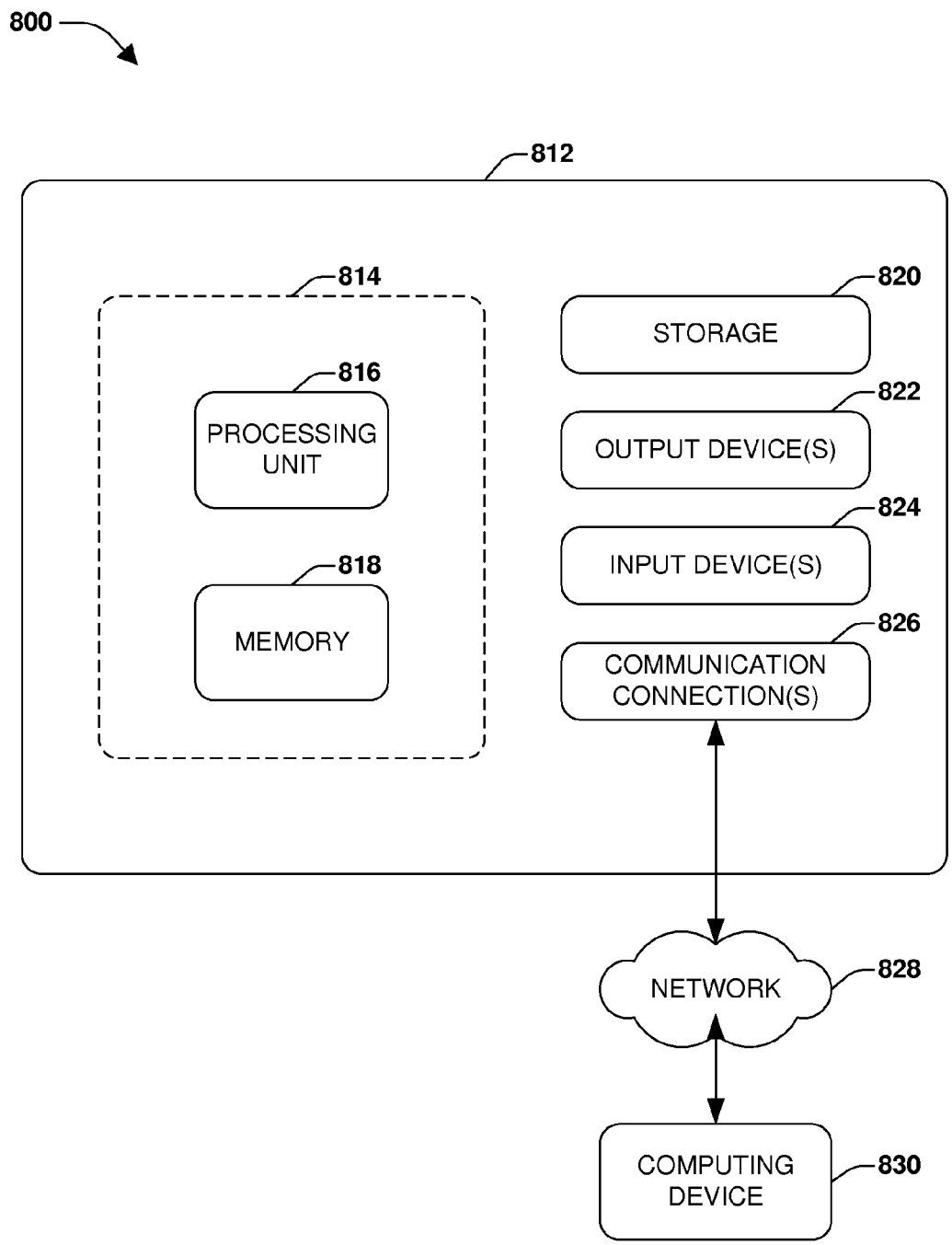
FIG. 8 illustrates an example computing environment wherein one or more of the provisions set forth herein is be implemented.

FIG. 8 and the following discussion provide a brief, general description of a suitable computing environment to implement embodiments of one or more of the provisions set forth herein. The operating environment of FIG. 8 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 8 illustrates an example of a system 800 comprising a computing device 812 configured to implement one or more embodiments provided herein. In one configuration, computing device 812 includes at least one processing unit 816 and memory 818. In some embodiments, depending on the exact configuration and type of computing device, memory 818 is volatile, such as RAM, non-volatile, such as ROM, flash memory, etc., or some combination of the two. This configuration is illustrated in FIG. 8 by dashed line 814.

In other embodiments, device 812 includes additional features or functionality. For example, device 812 also includes additional storage such as removable storage or non-removable storage, including, but not limited to, magnetic storage, optical storage, and the like. Such additional storage is illustrated in FIG. 8 by storage 820. In some embodiments, computer readable instructions to implement one or more embodiments provided herein are in storage 820. Storage 820 also stores other computer readable instructions to implement an operating system, an application program, and the like. Computer readable instructions are loaded in memory 818 for execution by processing unit 816, for example.

The term "computer readable media" as used herein includes computer storage media. Computer storage media includes volatile and nonvolatile, removable and non-removable media implemented in any method or technology for storage of information such as computer readable instructions or other data. Memory 818 and storage 820 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 812. Any such computer storage media is part of device 812.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 812 includes input device(s) 824 such as keyboard, mouse, pen, voice input device, touch input device, infrared cameras, video input devices, or any other input device. Output device(s) 822 such as one or more displays, speakers, printers, or any other output device are also included in device 812. Input device(s) 824 and output device(s) 822 are connected to device 812 via a wired connection, wireless connection, or any combination thereof. In some embodiments, an input device or an output device from another computing device are used as input device(s) 824 or output device(s) 822 for computing device 812. Device 812 also includes communication connection(s) 826 to facilitate communications with one or more other devices.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as implanting techniques, doping techniques, spin-on techniques, sputtering techniques such as magnetron or ion beam sputtering, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A system for treating a semiconductor device, comprising:
   a laser configured to emit a laser beam that performs an anneal operation on the semiconductor device;
   a sensor configured to measure a reflection intensity of the laser beam, the reflection intensity indicative of a magnitude at which the laser beam is reflected from the semiconductor device; and
   a controller configured to control thermal absorption of the laser beam by the semiconductor device by adjusting an applied intensity of the laser beam as a function of the reflection intensity and a specified thermal absorption rate for the anneal operation, the applied intensity indicative of a magnitude at which the laser beam is emitted from the laser.

2. The system of claim 1, the controller configured to not adjust the applied intensity when a degree of deviation between the reflection intensity and an average reflection intensity does not fall within a threshold.

3. The system of claim 1, the controller configured to adjust the applied intensity by adjusting an amount of power supplied to the laser.

4. The system of claim 1, the laser beam having a wavelength that heats the semiconductor device.

5. The system of claim 1, the sensor positioned spatially proximate the laser.

6. The system of claim 1, the sensor comprising a pyrometer.

7. The system of claim 1, the sensor configured to filter one or more wavelengths not associated with the laser beam.

8. The system of claim 1, a laser beam having a wavelength that heats a metal layer of the semiconductor device.

9. A system for treating a semiconductor device, comprising:
- a laser configured to emit a laser beam that performs an anneal operation on the semiconductor device;
- a sensor configured to measure a reflection intensity of the laser beam; and
- a controller configured to adjust an applied intensity of the laser beam as a function of the reflection intensity and a specified thermal absorption rate for the anneal operation.

10. The system of claim 9, the reflection intensity indicative of a magnitude at which the laser beam is reflected from the semiconductor device and the applied intensity indicative of a magnitude at which the laser beam is emitted from the laser.

11. The system of claim 9, the controller configured to adjust an amount of power supplied to the laser to adjust the applied intensity.

12. The system of claim 9, the sensor configured to filter one or more wavelengths associated with the laser beam from one or more wavelengths not associated with the laser beam.

13. The system of claim 9, the controller configured to compare a first measurement of the reflection intensity to an average measurement of the reflection intensity over a specified period of time to determine a degree of deviation between the first measurement and the average measurement.

14. The system of claim 13, the controller configured to adjust the applied intensity when the degree of deviation falls within a threshold and not adjust the applied intensity when the degree of deviation does not fall within the threshold.

15. A system for treating a semiconductor device, comprising:
- a laser configured to apply a laser beam to the semiconductor device;
- a sensor configured to measure a reflection intensity of the laser beam; and
- a controller configured to control thermal absorption of the laser beam by the semiconductor device by adjusting an applied intensity of the laser beam as a function of the reflection intensity and a specified thermal absorption rate for an anneal operation being performed on the semiconductor device using the laser beam.

16. The system of claim 15, the controller configured to compare a first measurement of the reflection intensity to an average measurement of the reflection intensity over a specified period of time to determine a degree of deviation between the first measurement and the average measurement.

17. The system of claim 16, the controller configured to adjust the applied intensity when the degree of deviation falls within a threshold and not adjust the applied intensity when the degree of deviation does not fall within the threshold.

18. The system of claim 15, the laser beam having a wavelength that heats the semiconductor device.

19. The system of claim 15, wherein a wavelength of the laser beam emitted from the laser and a wavelength of the laser beam detected by the sensor are a same wavelength.

20. The system of claim 15, the sensor configured to filter one or more wavelengths not associated with the laser beam.

* * * * *